(12) United States Patent
Silva et al.

(10) Patent No.: US 11,557,973 B2
(45) Date of Patent: *Jan. 17, 2023

(54) SINGLE-STAGE DC-DC POWER CONVERTER

(71) Applicant: ABB Power Electronics Inc., Plano, TX (US)

(72) Inventors: Arturo Silva, Allen, TX (US); Loc Ngo, Carrollton, TX (US); Richard Yeager, Rockwall, TX (US); Jouni Uusitalo, Rockwall, TX (US)

(73) Assignee: ABB Power Electronics Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/087,844

(22) Filed: Nov. 3, 2020

(65) Prior Publication Data

US 2021/0050792 A1    Feb. 18, 2021

Related U.S. Application Data

(63) Continuation of application No. 15/657,786, filed on Jul. 24, 2017, now Pat. No. 10,833,591.

(51) Int. Cl.
*H02M 3/335* (2006.01)
*H02M 3/28* (2006.01)
*H05K 1/18* (2006.01)
*H05K 1/02* (2006.01)
*H02M 3/00* (2006.01)

(52) U.S. Cl.
CPC ......... *H02M 3/285* (2013.01); *H02M 3/3353* (2013.01); *H02M 3/33573* (2021.05); *H02M 3/33592* (2013.01); *H05K 1/182* (2013.01); *H02M 3/003* (2021.05); *H05K 1/0263* (2013.01)

(58) Field of Classification Search
CPC ............ H02M 3/33569; H02M 3/285; H02M 3/3353; H02M 3/003; H02M 3/33523; H02M 3/158; H02M 3/1584; H02M 3/335–33592; H05K 1/182; H05K 1/0263; H05K 2201/10303
See application file for complete search history.

(56) References Cited

U.S. PATENT DOCUMENTS

| | | | |
|---|---|---|---|
| 4,441,146 A | 4/1984 | Vinciarelli | |
| 6,181,066 B1 | 1/2001 | Adamson | |
| 6,927,661 B2 | 8/2005 | He et al. | |
| 7,187,263 B2 | 3/2007 | Vinciarelli | |
| 7,315,463 B2 | 1/2008 | Schrom et al. | |
| 7,463,498 B1 * | 12/2008 | Djekic | H02M 3/33592 363/16 |
| 7,479,863 B2 | 1/2009 | Kit et al. | |
| 8,068,355 B1 | 11/2011 | Ikriannikov | |
| 8,917,156 B2 | 12/2014 | Garrity et al. | |
| 10,297,379 B2 | 5/2019 | Gold et al. | |

(Continued)

*Primary Examiner* — Thienvu V Tran
*Assistant Examiner* — Shahzeb K Ahmad
(74) *Attorney, Agent, or Firm* — Armstrong Teasdale LLP

(57) ABSTRACT

A power converter is provided. The power converter includes an input side having a first input winding and a second input winding coupled in electrical series to the first input winding. The power converter also includes an output side having a first output winding and a second output winding coupled in electrical parallel to the first output winding.

20 Claims, 4 Drawing Sheets

(56) References Cited

U.S. PATENT DOCUMENTS

| | | |
|---|---|---|
| 10,833,591 B2 | 11/2020 | Silva et al. |
| 2001/0030879 A1 | 10/2001 | Greenfeld et al. |
| 2008/0048818 A1 | 2/2008 | Mao et al. |
| 2009/0001945 A1* | 1/2009 | Wickersham ....... H02M 3/1584 |
| | | 323/263 |
| 2009/0109709 A1 | 4/2009 | Nakahori |
| 2009/0168461 A1 | 7/2009 | Nakahori |
| 2010/0128498 A1* | 5/2010 | Nymand ............... H02M 3/335 |
| | | 363/17 |
| 2011/0032683 A1* | 2/2011 | Li ........................ H05K 7/1432 |
| | | 361/760 |
| 2011/0101951 A1 | 5/2011 | Zhang et al. |
| 2014/0266552 A1 | 9/2014 | Silva et al. |
| 2017/0025961 A1* | 1/2017 | Seeman ............ H02M 3/33546 |
| 2017/0117815 A1* | 4/2017 | Sato .................. H02M 3/33546 |
| 2019/0348918 A1* | 11/2019 | Ojika ..................... H02M 1/14 |

\* cited by examiner

SINGLE-STAGE DC-DC POWER CONVERTER

BACKGROUND

The field of the invention relates generally to power converters, and more particularly, to single-stage DC-DC power converters.

As the human population grows, there is a constant need to provide more power without using up or misusing Earth's resources. Power converter circuit market trends indicate that each new generation of converter products generally deliver increased power density and higher efficiency, having reduced total power loss. In one example application, an intermediate bus power system includes a bus converter circuit that provides a DC bus voltage to a plurality of point-of-load converters circuits (POLs) through an intermediate bus structure. However, having multiple conversion stages results in more wasted energy, and provides larger footprints and increased radiated emissions.

BRIEF DESCRIPTION

In one embodiment, a power converter is provided. The power converter includes an input side having a first input winding and a second input winding coupled in electrical series to the first input winding. The power converter also includes an output side having a first output winding and a second output winding coupled in electrical parallel to the first output winding.

In another embodiment, a method of assembling a power converter is provided. The method includes providing a first input winding, and coupling a second input winding in electrical series to the first input winding. The first and second input windings define an input side of the power converter. The method also includes providing a first output winding, and coupling a second output winding in electrical parallel to the first output winding. The first and second output windings define an output side of the power converter.

Although specific features of various embodiments may be shown in some drawings and not in others, this is for convenience only. Any feature of any drawing may be referenced and/or claimed in combination with any feature of any other drawing.

DETAILED DESCRIPTION

Figure 1:
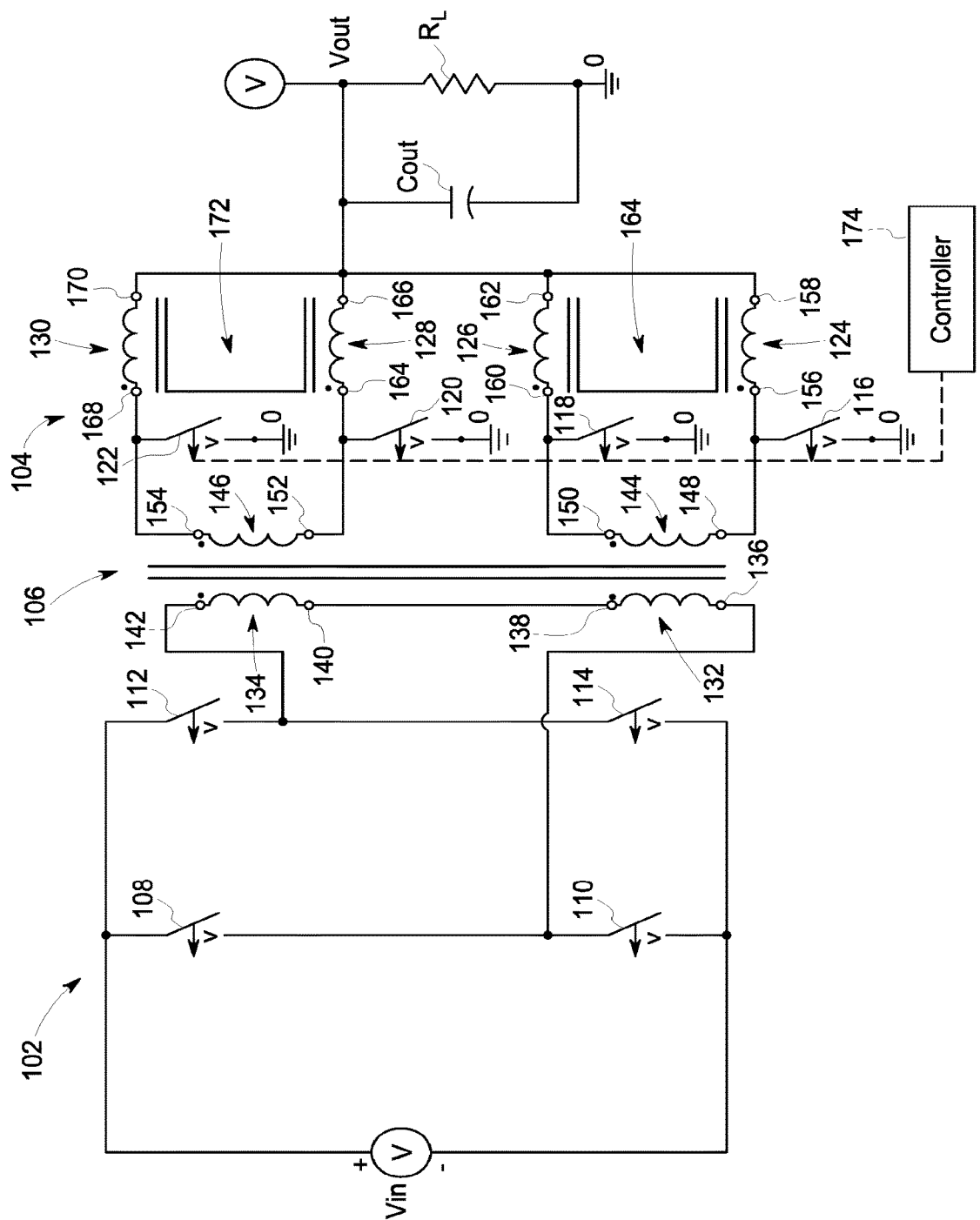
FIG. 1 is a circuit diagram of an exemplary power converter.

FIG. 1 is a circuit diagram of an exemplary power converter 100. Power converter 100 is configured to convert an input voltage $V_{in}$ to an output voltage $V_{out}$. Power converter 100 includes an input side 102 and an output side 104 that are isolated from one another by galvanic isolation by a transformer 106. Thus, input side 102 and output side 104 include separate grounding structures.

Input side 102 includes an input voltage $V_{in}$ having positive and negative terminals (indicated by "+" and "−" signs, respectively), a first switching device 108, a second switching device 110, a third switching device 112, and a fourth switching device 114. Switching devices 108, 110, 112, and 114 are electrically connected to transformer 106. Output side 104 includes a fifth switching device 116, a sixth switching device 118, a seventh switching device 120, an eighth switching device 122, a plurality of output inductors 124, 126, 128, 130, a capacitance device $C_{out}$, and a load $R_L$. The output voltage $V_{out}$ is the voltage across load $R_L$.

In the exemplary embodiment, on input side 102, transformer 106 includes a first input winding 132 coupled in electrical series to a second input winding 134. More specifically, first input winding 132 includes a first terminal 136 and a second terminal 138. Second input winding 134 includes a first terminal 140 that is electrically coupled to second terminal 138 of first input winding 132, and a second terminal 142.

In the exemplary embodiment, first switching device 108 is coupled to first terminal 136 of first input winding 132 and to the positive terminal of input voltage $V_{in}$. Second switching device 110 is coupled to first terminal 136 of first input winding 132 and to the negative terminal of input voltage $V_{in}$. Third switching device 112 is coupled to second terminal 142 of second input winding 134 and to the positive terminal of input voltage $V_{in}$. Fourth switching device 114 is coupled to second terminal 142 of second input winding 134 and to the negative terminal of input voltage $V_{in}$. In the exemplary embodiment, switching devices 108, 110, 112, and 114 form a full bridge rectifier.

On output side 104, transformer 106 includes a first output winding 144 coupled in electrical parallel to a second output winding 146. More specifically, first output winding 144 includes a first terminal 148 and a second terminal 150. Second output winding 146 includes a first terminal 152 and a second terminal 154.

Fifth switching device 116 is coupled to first terminal 148 of first output winding 144 and to a common ground GND. Sixth switching device 118 is coupled to second terminal 150 of first output winding 144 and common ground GND. Seventh switching device 120 is coupled to first terminal 152 of second output winding 146 and common ground GND. Eighth switching device 122 is coupled to second terminal 154 of second output winding 146 and common ground GND.

First output inductor 124 includes a first terminal 156 coupled to first terminal 148 of first output winding 144, and a second terminal 158. Second output inductor 126 includes a first terminal 160 coupled to second terminal 150 of first output winding 144, and a second terminal 162. Second terminal 158 of first output inductor 124 and second terminal 162 of second output inductor 126 are coupled together. This arrangement of first and second output inductors 124 and 126 forms a first current doubler 164 at the output of first output winding 144.

Third output inductor 128 includes a first terminal 165 coupled to first terminal 152 of second output winding 146, and a second terminal 166. Fourth output inductor 130 includes a first terminal 168 coupled to second terminal 154 of second output winding 146, and a second terminal 170. Second terminal 166 of third output inductor 128 and second terminal 170 of fourth output inductor 130 are coupled together. This arrangement of third and fourth output inductors 128 and 130 forms a second current doubler 172 at the output of second output winding 146.

Moreover, second terminals 158 and 162 of first and second output inductors 124 and 126 are coupled to second terminals 166 and 170 of third and fourth output inductors 128 and 130. As a result, first current doubler 164 is coupled in electrical parallel to second current doubler 172.

Load $R_L$ is coupled in parallel to first and second current doublers 164 and 172. A capacitance device $C_{out}$ is preferably coupled in parallel with load $R_L$ to filter output voltage $V_{out}$ of power converter 100.

In the exemplary embodiment, switching devices 108-114 and 116-120 are metal-oxide semiconductor field-effect transistors ("MOSFETs"), although any other suitable switching device that enables power converter 100 to function as described herein may be used. In alternative embodiments, input side 102 and output side 104 may include any suitable number of switching devices arranged in any suitable configuration that enables power converter 100 to function as described herein.

In the exemplary embodiment, power converter 100 is configured to perform DC-DC conversion from 48V to 1V with a high output current. The high output current is about 230 amps, but may be any value between about 100 to 300 amps. First and second input windings 132 and 134 each include 5 turns, while first and second output windings 144 and 146 each include turn. This results in a 5:1 turns ratio on each transformer winding.

On output side 104, two of inductors 124 and 128, 126 and 130 work simultaneously based on the switching sequence from a controller 174. Two inductors are charging, while the other two inductors are discharging. The benefit is that with four branches splitting the output current of 230 A, each branch carries about 57.5 A to the load. By coupling each pair of inductors 124/126 and 128/130, the core area between them is reduced, enabling four devices that carry ¼ of the total current. Using a single output inductor similar to typical known approaches requires a very large inductor to do the same job.

Further, controller 174 is configured to monitor current output by each of inductors 124-130. Based on the monitored output current, controller 174 is configured to compensate for any imbalances in the inductance or the PWB or the FETs to control each of inductors 124-130 outputting ¼ of the power.

Figure 2:
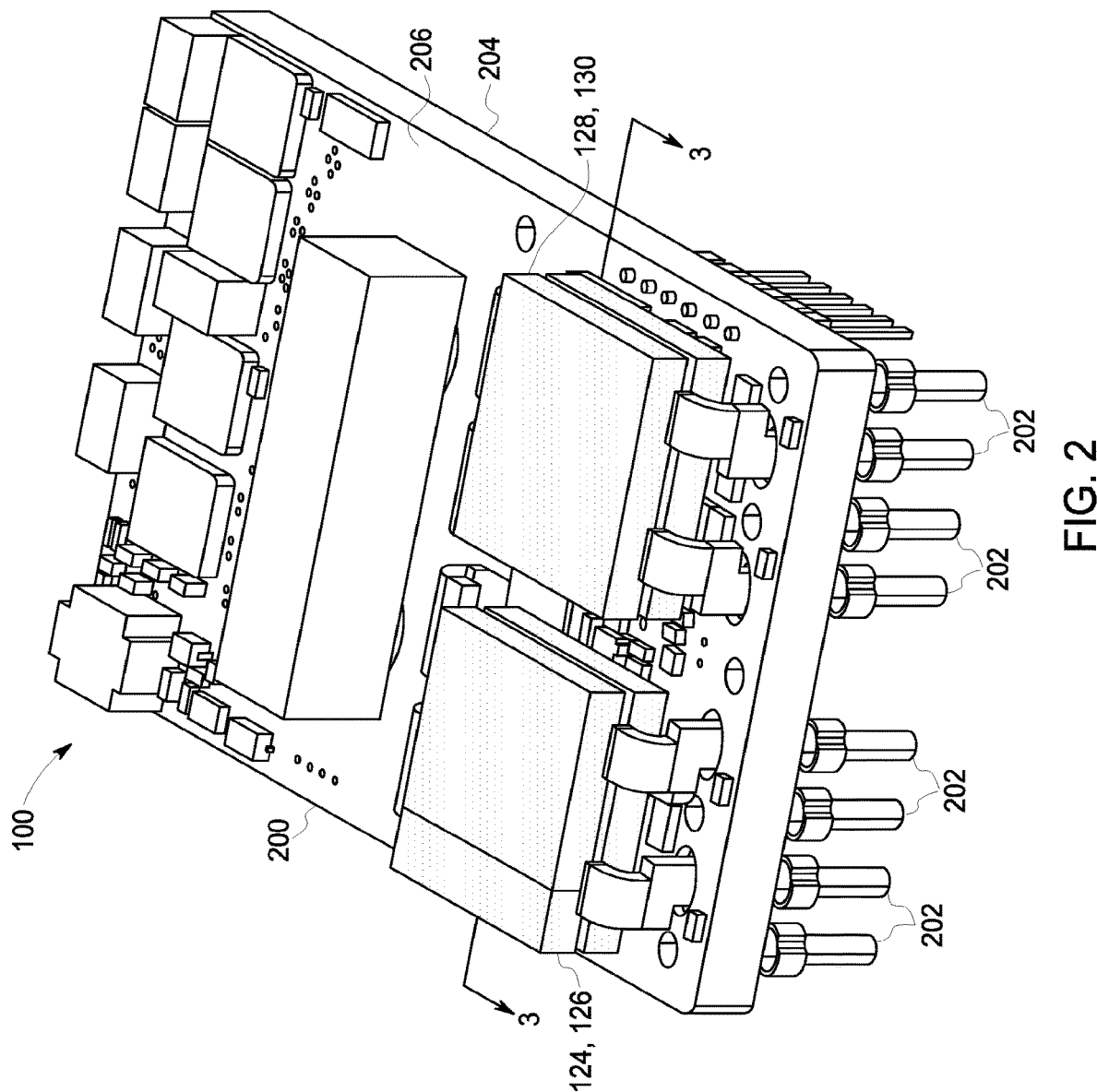
FIG. 2 is a perspective view of the power converter shown in FIG. 1 embodied on a PWB.
Figure 3:
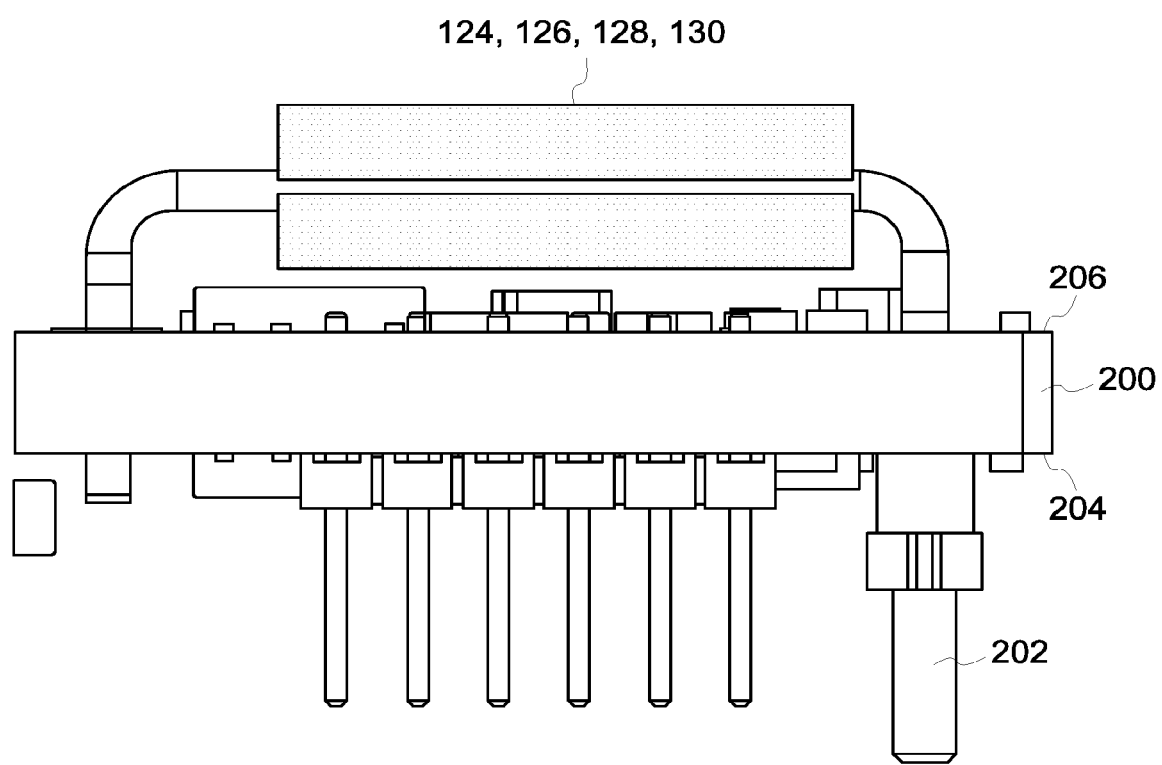
FIG. 3 is a side view of the PWB shown in FIG. 2 illustrating a connection of the inductors shown in FIGS. 1 and 2.
Figure 4:
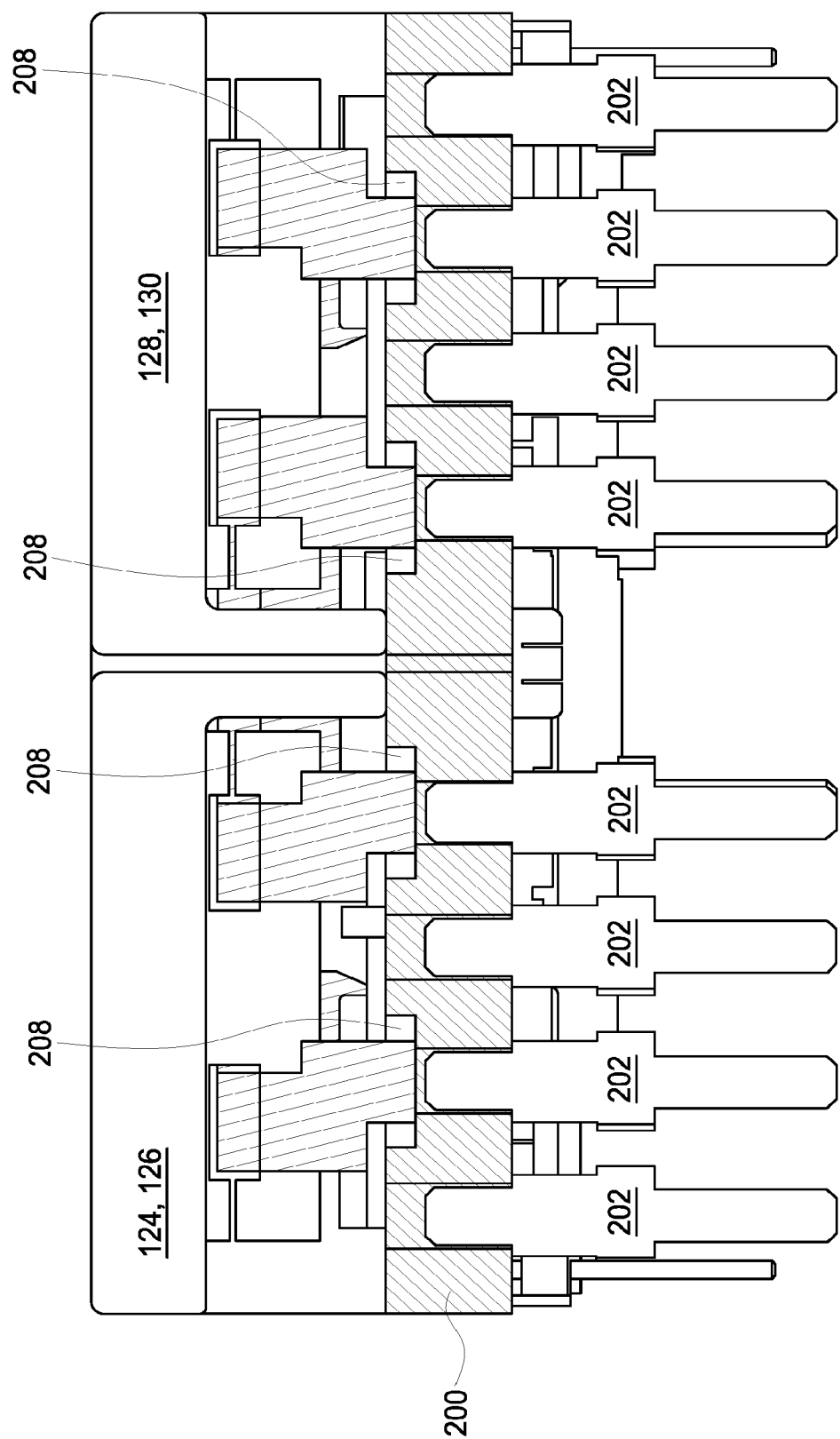
FIG. 4 is a cross-sectional view of the PWB shown in FIG. 2 taken at line 2-2.

FIG. 2 is a perspective view of power converter 100 (shown in FIG. 1) embodied on a PWB 200. FIG. 3 is a side view of PWB 200 illustrating a connection of inductors 124-130 on PWB 200. FIG. 4 is a cross-sectional view of PWB 200 taken at line 2-2.

Because of the large amount of output current (i.e. 230A), known systems include an inductor soldered onto the PWB, and output pins soldered to the PWB and traces to transfer the current out to a customer PWB. To reduce the number of soldering connections and thus, reduce the amount of current loss, PWB 200 includes a plurality of output pins 202 coupled to a bottom side 204 of PWB 200. Each output pin 202 is not quite a hole through PWB 200, but rather each output pin 202 extends about halfway through PWB 200. A top side 206 of PWB 200 includes voids 208 for receiving inductors 124-130.

Second terminal 158, 162, 166, 170 of each inductor 124-130 includes a leg that is shorter than the leg of first terminal 156, 160, 165, 168. As opposed to extending through PWB 200 and being soldered in place, second terminals 158, 162, 166, 170 are inserted into voids 208 on PWB 200 and connect directly to output pins 202. A small amount of solder couples second terminals 158, 162, 166, 170 in place.

Exemplary embodiments of single stage DC-DC power converters are described herein. A power converter includes an input side having a first input winding and a second input winding coupled in electrical series to the first input winding. The power converter also includes an output side having a first output winding and a second output winding coupled in electrical parallel to the first output winding.

As compared to at least some power converters, in the systems and methods described herein, a power converter utilizes parallel-coupled output windings that are electrically coupled in electrical parallel a respective current doubler. The current doublers include four output inductors, each coupled to a respective terminal each of the parallel-coupled output windings. Using the parallel-coupled output windings electrically coupled in parallel to current doublers facilitates a single stage DC-DC power converter that does not require an intermediate conversion stage, thereby reduces the footprint of the power converter, while reducing loss and improving efficiency of the power converter.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power converter, comprising:
   a transformer having an input side and an output side, the input side and output side being galvanically isolated from each other, wherein the input side comprises (i) a first input winding having first and second terminals and (ii) a second input winding having third and fourth terminals, wherein the third terminal of the second input winding is directly connected to the second terminal of the first input winding to connect the first and second input windings in electrical series, and wherein the output side comprises (i) a first output winding having fifth and sixth terminals and (ii) a second output winding having seventh and eighth terminals;
   a first current doubler coupled to the first output winding, wherein the first current doubler comprises a first output inductor having (i) a ninth terminal coupled to the fifth terminal of the first output winding and (ii) a tenth terminal directly connected to a load terminal of the power converter;

a second current doubler coupled to the second output winding;

first, second, third, and fourth switches configured to couple a voltage source to the first and second input windings, wherein the first and second switches are coupled to the first terminal of the first input winding and the third and fourth switches are coupled to the fourth terminal of the second input winding; and a controller configured to monitor current output by the first and second current doublers and to compensate for imbalances between the first and second current doublers through upstream control of the first and second current doublers.

2. The power converter of claim 1, wherein:

the first current doubler comprises:
a second output inductor having (i) an eleventh terminal coupled to the sixth terminal of the first output winding and (ii) a twelfth terminal directly connected to the load terminal; and the second current doubler comprises:
a third output inductor having (i) a thirteenth terminal coupled to the seventh terminal of the second output winding and (ii) a fourteenth terminal directly connected to the load terminal; and
a fourth output inductor having (i) a fifteenth terminal coupled to the eighth terminal of the second output winding and (ii) a sixteenth terminal directly connected to the load terminal.

3. The power converter of claim 2, wherein each of the first, second, third, and fourth output inductors is configured to output at least a portion of a current to the load terminal.

4. The power converter of claim 3, wherein each of the first, second, third, and fourth output inductors is configured to output ¼ of the current to the load terminal.

5. The power converter of claim 2, further comprising a printed wiring board (PWB) comprising a top side and a bottom side.

6. The power converter of claim 5, wherein the controller is further configured to compensate for imbalances in at least one of the PWB and the first, second, third, and fourth switches to control each of the first, second, third, and fourth output inductors to output ¼ of output power to the load terminal.

7. The power converter of claim 5, further comprising a plurality of output pins extending approximately halfway through the bottom side of the PWB.

8. The power converter of claim 7, further comprising at least one void defined in the top side of the PWB, the at least one void corresponding to an output pin of the plurality of output pins and configured to receive an output terminal of an output inductor.

9. The power converter of claim 1, wherein the input side and the output side of the transformer comprise separate respective grounding structures.

10. The power converter of claim 1, wherein the first input winding correlates to the first output winding, and wherein the second input winding correlates to the second output winding.

11. The power converter of claim 10, wherein:

the first input winding and the first output winding have a turns ratio of 5:1, and the second input winding and the second output winding have a turns ratio of 5:1.

12. The power converter of claim 1, wherein the power converter is configured to perform direct current to direct current (DC-DC) conversion.

13. The power converter of claim 12, wherein the power converter is configured to perform single stage DC-DC conversion.

14. The power converter of claim 13, wherein the power converter is configured to perform single stage DC-DC conversion from 48 V to 1 V.

15. A method of assembling a power converter, comprising:

installing a transformer having an input side and an output side, the input side and output side being galvanically isolated from each other, wherein the input side comprises (i) a first input winding having first and second terminals and (ii) a second input winding having third and fourth terminals, wherein the third terminal of the second input winding is directly connected to the second terminal of the first input winding to connect the first and second input windings in electrical series, and wherein the output side comprises (i) a first output winding having fifth and sixth terminals and (ii) a second output winding having seventh and eighth terminals;

coupling a first current doubler to the first output winding by (i) coupling a ninth terminal of a first output inductor to the fifth terminal of the first output winding, and (ii) coupling a tenth terminal of the first output inductor directly to a load terminal;

coupling a second current doubler to the second output winding;

coupling first, second, third, and fourth switches to the first and second input windings, wherein the first and second switches are coupled to the first terminal of the first input winding and the third and fourth switches are coupled to the fourth terminal of the second input winding; and installing a controller configured to monitor current output by the first and second current doublers and to compensate for imbalances between the first and second current doublers through upstream control of the first and second current doublers.

16. The method of claim 15, wherein:

coupling the first current doubler to the first output winding comprises: (i) coupling an eleventh terminal of a second output inductor to the sixth terminal of the first output winding, and (ii) coupling a twelfth terminal of the second output inductor to the load terminal and to the tenth terminal of the first output inductor; and coupling the second current doubler to the second output winding comprises: (i) coupling a thirteenth terminal of a third output inductor to the seventh terminal of the second output winding, (ii) coupling a fourteenth terminal of the third output inductor to the load terminal, (iii) coupling a fifteenth terminal of a fourth output inductor to the eighth terminal of the second output winding, and (iv) coupling a sixteenth terminal of the fourth output inductor to the load terminal and to the fourteenth terminal of the second output inductor.

17. The method of claim 15, further comprising coupling the input side and the output side of the transformer to separate respective grounding structures.

18. A power converter, comprising:

a transformer having an input side and an output side, the input side comprising a first input winding in series with a second input winding, the output side comprising a first output winding and a second output winding;

a first current doubler coupled to the first output winding, wherein the first current doubler comprises a first output inductor coupling one side of the first output winding directly to a load terminal of the power converter;

a second current doubler coupled to the second output winding;

first, second, third, and fourth switches configured to couple a voltage source to the first and second input windings, wherein the first and second switches are coupled in series with a first node therebetween coupled to one side of the first and second input windings, and wherein the third and fourth switches are coupled in series with a second node therebetween coupled to another side of the first and second input windings; and a controller configured to monitor current output by the first and second current doublers and to compensate for imbalances between the first and second current doublers through upstream control of the first and second current doublers.

19. The power converter of claim 18, wherein:

the first current doubler comprises:

a second output inductor coupling another side of the first output winding to the load terminal; and the second current doubler comprises:

a third output inductor coupling one side of the second output winding to the load terminal; and a fourth output inductor coupling another side of the second output winding to the load terminal.

20. The power converter of claim 19, further comprising:

a printed wiring board (PWB) comprising a top side and a bottom side, wherein the controller is further configured to compensate for imbalances in at least one of the PWB and the first, second, third, and fourth switches to control each of the first, second, third, and fourth output inductors to output ¼ of output power to the load terminal.

* * * * *